(12) United States Patent  (10) Patent No.: US 7,269,012 B2
Lee et al.                 (45) Date of Patent:     Sep. 11, 2007

(54) HEAT DISSIPATION DEVICE FOR HEAT-GENERATING ELECTRONIC COMPONENT

(75) Inventors: Hsieh-Kun Lee, Tu-Cheng (TW); Wan-Lin Xia, Shenzhen (CN); Tao Li, Shenzhen (CN); Min-Qi Xiao, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 32 days.

(21) Appl. No.: 11/268,079

(22) Filed: Nov. 7, 2005

(65) Prior Publication Data

US 2006/0245162 A1    Nov. 2, 2006

(30) Foreign Application Priority Data

Apr. 29, 2005  (CN) .................. 2005 1 0034516

(51) Int. Cl.
*H05K 7/20* (2006.01)
(52) U.S. Cl. .................... 361/700; 361/701; 165/80.3
(58) Field of Classification Search ........ 361/700–701, 361/697; 165/80.3
See application file for complete search history.

(56) References Cited

U.S. PATENT DOCUMENTS 6,883,594 B2    4/2005  Sarraf et al.
6,903,930 B2    6/2005  DiStefano et al.
6,909,608 B2    6/2005  Fan
7,031,159 B2 *  4/2006  DiStefano et al. .......... 361/700
7,167,364 B2 *  1/2007  Lopatinsky et al. ........ 361/697
2005/0056400 A1 3/2005  Chen et al.
2005/0061479 A1 3/2005  Lee et al.
2005/0067144 A1 3/2005  Chou
2005/0092465 A1 5/2005  Lin et al.
2005/0094375 A1 5/2005  Chiang et al.
2005/0099774 A1 * 5/2005 Song ........................ 361/700

FOREIGN PATENT DOCUMENTS

TW       M241964    8/2004
TW       M252986    12/2004
TW       M255648    1/2005

* cited by examiner

*Primary Examiner*—Michael C. Zarroli
(74) *Attorney, Agent, or Firm*—Morris Manning & Martin LLP; Tim Tingkang Xia, Esq.

(57) ABSTRACT

A heat dissipation device includes a first heat sink (10), a second heat sink (20), a pair of heat pipes (30) connecting the first heat sink and the second heat sink and a fan assembly (40) located between the first heat sink and the second heat sink. The first heat sink comprises a base (12), a cover (14) and a plurality of heat dissipating fins (16) sandwiched between the base and the cover. The second heat sink comprises a plurality of cooling fins (22). Each heat pipe comprises three portions, respectively orderly sandwiched between the base and the heat dissipating fins, sandwiched between the cover and the heat dissipating fins and thermally extending in the cooling fins.

18 Claims, 2 Drawing Sheets

HEAT DISSIPATION DEVICE FOR HEAT-GENERATING ELECTRONIC COMPONENT

BACKGROUND

1. Field

The present invention relates generally to a heat dissipation device, and more particularly to a heat dissipation device using heat pipes for enhancing heat removal from heat-generating electronic components.

2. Related Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the heat quickly, for example by using a heat dissipation device attached to the CPU in the enclosure. This allows the CPU and other electronic components in the enclosure to function within their normal operating temperature ranges, thereby assuring the quality of data management, storage and transfer.

A conventional heat dissipation device comprises a first heat sink, a second heat sink and a pair of heat pipes connecting the first heat sink and the second heat sink. The first heat sink comprises a base and a plurality of fins extending from the base. The base defines two grooves in a top surface thereof, and a bottom surface of the base is attached to an electronic component. Each heat pipe has an evaporating portion accommodated in one of the grooves and a condensing portion inserted in the second heat sink. The base absorbs heat produced by the electronic component and transfers heat directly to the fins of the first heat sink and the second heat sink through the heat pipes. Because of an increased heat dissipating area, heat dissipation efficiency of the heat dissipation device is correspondingly improved.

However, due to structural limitation, there is no contact between the heat pipes and top of the fins of the first heat sink, which results in that the heat removal efficiency by the prior art heat dissipation device still cannot meet the increasing heat removing requirement for the up-to-the minute heat-generating electronic devices.

SUMMARY

What is needed is a heat dissipation device with heat pipes which has an improved heat dissipation efficiency.

A heat dissipation device in accordance with a preferred embodiment of the present invention comprises a first heat sink, a second heat sink, a pair of heat pipes connecting the first heat sink and the second heat sink and a fan assembly located between the first heat sink and the second heat sink. The first heat sink comprises a base, a cover and a plurality of first fins sandwiched between the base and the cover. The second heat sink comprises a plurality of second fins. Each heat pipe is configured with a substantially rectangular contour, having a first transferring portion sandwiched between the base and the first fins, a second transferring portion sandwiched between the cover and the first fins, a connecting portion interconnecting the first and second transferring portions, and a third transferring portion extending in the second fins and thermally connecting therewith.

Other advantages and novel features of the invention will become more apparent from the following detailed description when taken in conjunction with the accompanying drawings, in which:

DETAILED DESCRIPTION OF THE INVENTION

Figure 1:
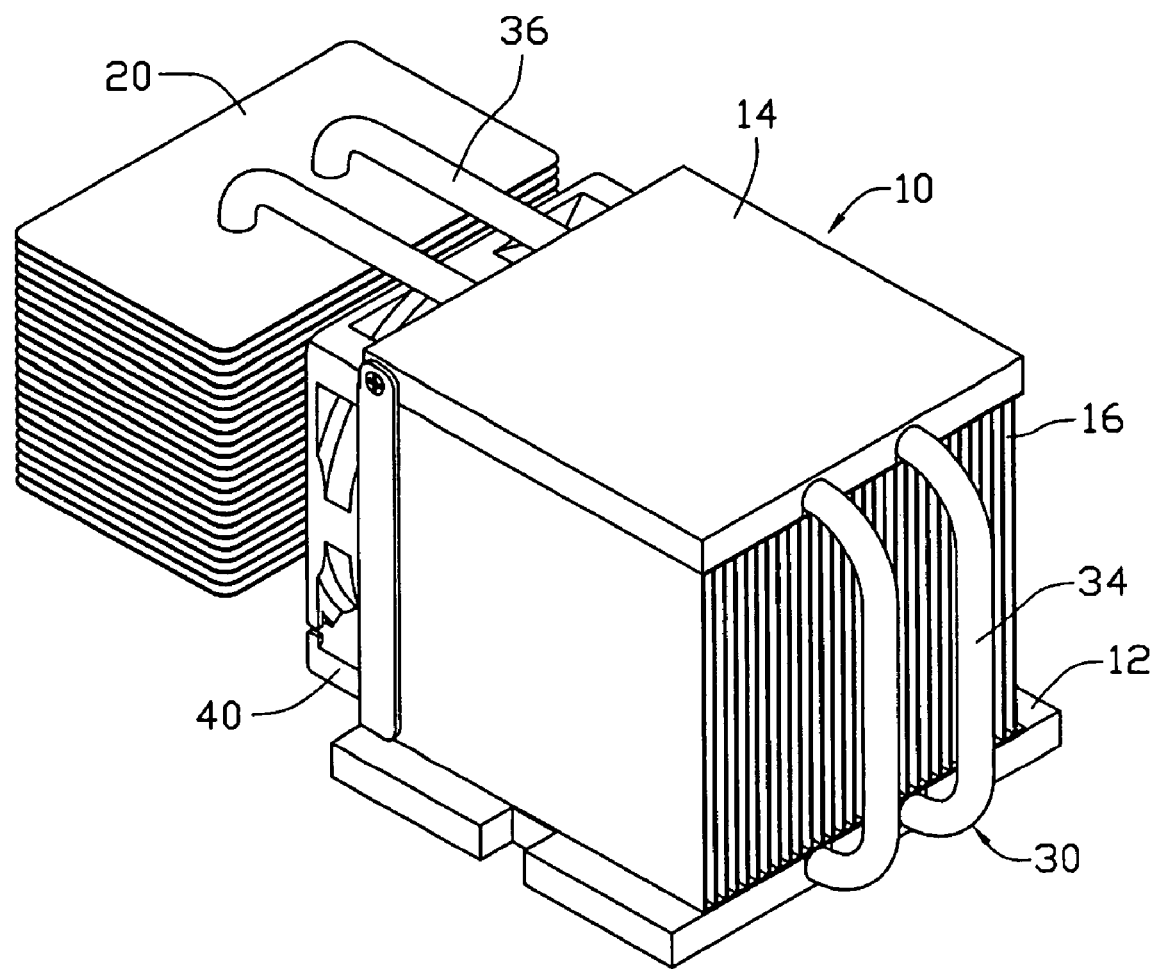
FIG. 1 is an assembled view of a heat dissipation device in accordance with a preferred embodiment of the present invention.

FIG. 1 shows a heat dissipation device in accordance with a preferred embodiment of the present invention. The heat dissipation device comprises a first heat sink 10, a second heat sink 20, a pair of heat pipes 30 connecting the first heat sink 10 and the second heat sink 20 and a fan assembly 40 located between the first heat sink 10 and the second heat sink 20.

Figure 2:
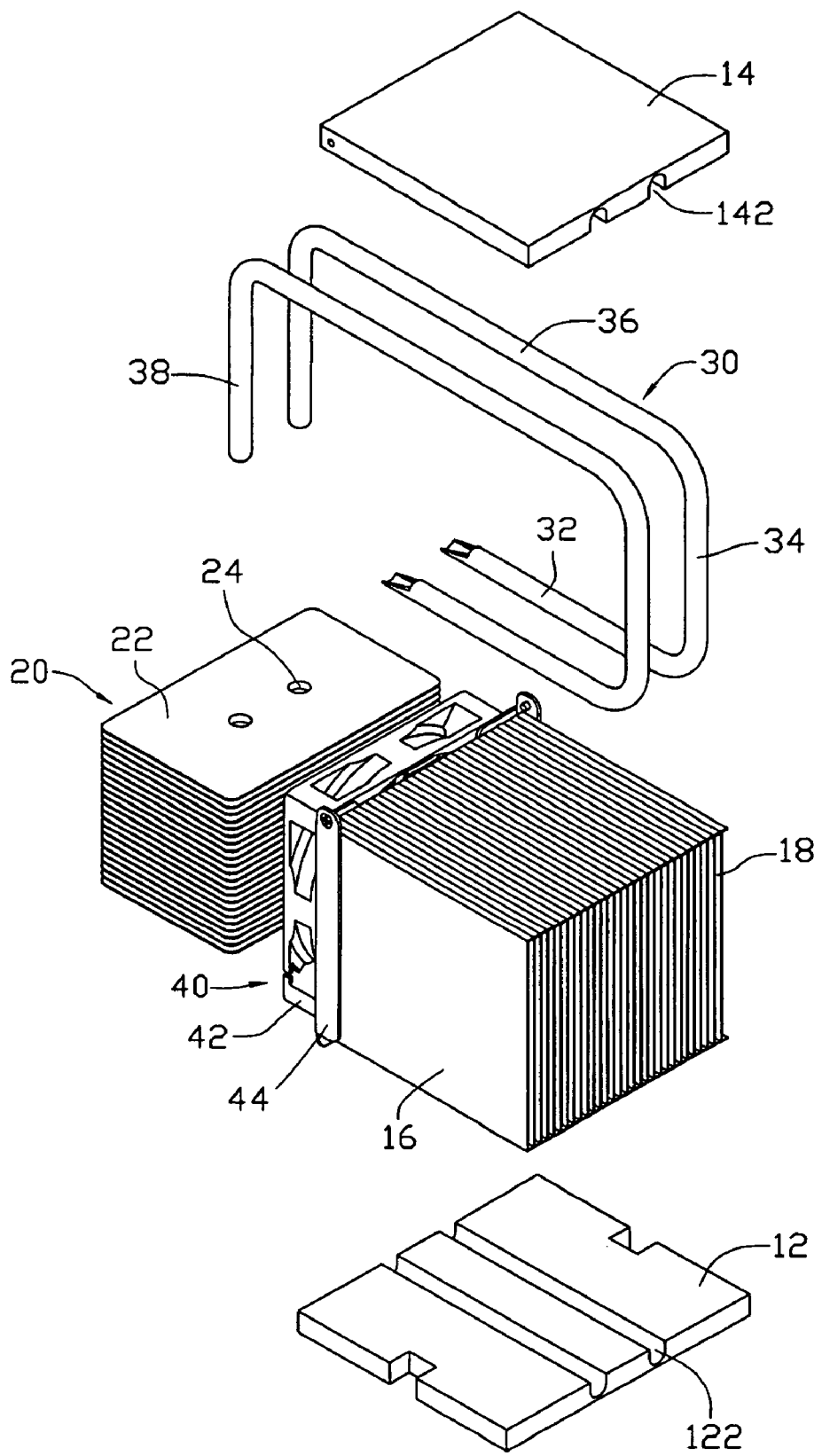
FIG. 2 is an exploded view of FIG. 1.

Referring to FIG. 2, the first heat sink 10 comprises a base 12, a cover 14 spaced opposite to the base 12, and a plurality of spaced first fins 16 sandwiched between the base 12 and the cover 14. The first fins 16 are oriented to be perpendicular to the base 12 and the cover 14. A plurality of channels 18 is defined between the first fins 16. The base 12 has a bottom surface for being attached to a heat-generating electrical component (not shown) such as a CPU, and a top surface opposite to the bottom surface. The base 12 defines a pair of first grooves 122 in the top surface thereof. The cover 14 defines a pair of second grooves 142 in a bottom surface thereof. Each first fin 16 forms a flange at each of top and bottom ends thereof. All flanges at top ends of the first fins 16 define a top plane. All flanges at bottom ends of the first fins 16 define a bottom plane. The base 12 and cover 14 are respectively soldered to the top and bottom planes.

The second heat sink 20 is located beside the first heat sink 10 and comprises a plurality of second fins 22. Each second fin 22 defines a pair of holes 24 for a portion of the heat pipes 30 to be inserted therein. Each heat pipe 30 is bent to have a generally rectangular contour. Each heat pipe 30 has a first transferring portion 32 accommodated in one of the first grooves 122, a second transferring portion 36 accommodated in one of the second grooves 142, a connecting portion 34 interconnecting the first and second transferring portions 32, 36, and a third transferring portion 38 extending from the second transferred portion 36 into one of the holes 24. The first transferring portions 32 are secured in the first grooves 122 and the second transferring portions 36 are secured in the second grooves 142 by soldering. The first transferring portion 32 is parallel to the second transferring portion 36. The third transferring portion 38 is perpendicular to the first transferring portion 32 and second transferring portion 36. The first transferring portions 32 of the heat pipes 30 are sandwiched between the base 12 and the bottom of the first fins 16. The second transferring portions 36 extending through the cover 14 are sandwiched between the cover 14 and the top of the first fins 16. The third transferring portions 38 sufficiently thermally contact with each second fin 22 by extending in and through the holes 24. The third transferring portions 38 are secured in the holes 24 by soldering.

The fan assembly 40 is mounted to a lateral side of the first heat sink 10 and comprises a fan 42 and a fan holder 44 securely engaged with the base 12 and the cover 14 for facilitating to hold the fan 42 in position to the first heat sink 10. The fan holder 44 abuts against outmost ones of the first fins 16, wherein the fan 42 is mounted at a substantially central portion of the fan holder 44. An airflow generated by the fan 42 enters the fan 42 after passing through the channels 18. The airflow then blows through the second heat sink 20, so that the airflow flows from the first fins 16 of the first heat sink 10 to the second fins 22 of the second heat sink 20 via the fan 42 to take away a great amount of heat from the first and second fins 16, 22.

The base 12 absorbs heat from the heat-generating electrical component and a part of the heat is directly transferred to the first fins 16 via a connection between the first fins 16 and the base 12. The other part of the heat is absorbed by the first transferred portions 32 and transferred to the second transferred portions 36 and the third transferred portions 38. The heat transferred to the second transferred portions 36 is transferred to the first fins 16 via a connection between the first fins 16 and the cover 14. The heat transferred to the third transferred portions 38 is transferred to the second fins 22 via a connection between the third transferred portions 38 and the second fins 22. The heat absorbed by the base 12 is dissipated to the first fins 16 from the top and bottom planes thereof, and evenly distributed on each first fin 16. The third transferred portions 38 transmit the heat to the second fins 22 by sufficiently contacting with the second fins 22. So the heat pipes 30 evenly dissipates the heat to both the first heat sink 10 and the second heat sink 20. Heat dissipation efficiency of the heat dissipation device is improved because of a great amount of contacting area between the heat pipes 30 and the first and second heat sinks 10, 20. In this embodiment, the first transferred portions 32 are structured as evaporating portions and the second transferred portions 36 and the third portions 38 are structured as condensing portions of the heat pipes 30. The airflow flows through the first, second heat sinks 10, 20 and to take heat away therefrom. In an alternative embodiment, it is feasible that the electronic component is positioned to thermally contact with the cover 14 instead of the base 12. That is to say, the heat dissipation device of the present invention is used in a reversed manner. For such use, the second transferring portions 36 should be structured as evaporating portions and the first and third transferring portions 32, 38 should be structured as condensing portions of the heat pipes 30.

It is understood that the invention may be embodied in other forms without departing from the spirit thereof. Thus, the present examples and embodiments are to be considered in all respects as illustrative and not restrictive, and the invention is not to be limited to the details given herein.

We claim:

1. A heat dissipation device comprising:
   a fan generating an airflow;
   a first heat sink placed at a side of the fan, the first heat sink comprising a base, a cover opposite to the base and a plurality of first fins sandwiched between the base and the cover;
   a second heat sink disposed at another side of the fan opposite to the first heat sink, the second heat sink comprising a plurality of second fins being parallel to the base and the cover; and
   at least one heat pipe connecting the base and cover and further extending into the second fins, and wherein the airflow flows from the first fins to the second fins via the fan.

2. The heat dissipation device as claimed in claim 1, wherein a plurality of channels is defined between the first fins to guide the airflow flowing through the first heat sink to enter the fan.

3. The heat dissipation device as claimed in claim 2, further comprising a fan holder abutting against outmost ones of the first fins, and wherein the fan is mounted at a substantially central portion of the fan holder so that the airflow enters the fan after flowing through the channels.

4. The heat dissipation device as claimed in claim 1, wherein the at least one heat pipe comprises portions respectively disposed in the base, the cover and inserted in the second fins.

5. The heat dissipation device as claimed in claim 3, wherein the base defines a first groove accommodating the portion of the at least one heat pipe disposed in the base and the cover defines a second groove accommodating the portion of the at least one heat pipe disposed in the cover.

6. A heat dissipation device comprising:
   a base;
   a cover parallel to the base;
   a plurality of first fins sandwiched between the base and the cover, the plurality of first fins defining a plurality of air passageways therein;
   a plurality of second fins disposed beside the plurality of first fins;
   a fan assembly placed between the plurality of first fins and the plurality of second fins; and
   at least one heat pipe thermally connecting the base and the cover and extending in the plurality of second fins.

7. The heat dissipation device as claimed in claim 6, wherein the base defines at least one first groove accommodating the at least one heat pipe contacting with the base.

8. The heat dissipation device as claimed in claim 6, wherein the cover defines at least one second groove accommodating the at least one heat pipe contacting with the cover.

9. The heat dissipation device as claimed in claim 6, wherein the at least one heat pipe comprises three portions, respectively sandwiched between the base and the first fins, sandwiched between the cover and the first fins and thermally received in the second fins.

10. The heat dissipation device as claimed in claim 9, wherein the portion of the at least one heat pipe received in the second fins is perpendicular to the other portions sandwiched between the base and the first fins and sandwiched between the cover and the first fins.

11. The heat dissipation device as claimed in claim 6, wherein the fan assembly is arranged at a side of the first fins.

12. The heat dissipation device as claimed in claim 11, wherein the fan assembly comprises a fan and a fan holder securely engaged with the base and the cover for facilitating to hold the fan in position to the first fins.

13. A heat dissipation device comprising:
   a first heat sink for contacting with a heat-generating electronic component;
   a second heat sink;
   a fan mounted between the first heat sink and the second heat sink; and
   a heat pipe having a first transferring portion thermally engaging with a lower portion of the first heat sink, a second transferring portion thermally engaging with an upper portion of the first heat sink, a connecting portion interconnecting the first and second transferring portions, and a third transferring portion thermally engaging with the second heat sink;

wherein the second heat sink defines a hole therein, and the third transferring portion is inserted in the hole; and wherein the first heat sink has a base attached to a bottom thereof, and a cover attached to a top thereof, the first transferring portion of the heat pipe being sandwiched between the base and the bottom of the first heat sink, and the second transferring portion being sandwiched between the cover and the top of the first heat sink, the base being adapted for contacting with the heat-generating electronic component.

14. The heat dissipating device as claimed in claim 13, wherein the second heat sink comprises of a plurality of fins oriented parallel to the base, the hole being defined through the fins, the first heat sink comprises a plurality of fins oriented perpendicular to the base.

15. The heat dissipating device as claimed in claim 13, wherein the cover and base form grooves respectively receiving the second and first transferring portions of the heat pipe therein.

16. The heat dissipating device as claimed in claim 13, wherein an air flow generated by the fan flows first through the fins of the first heat sink, then the fan, and finally the fins of the second heat sink.

17. The heat dissipating device as claimed in claim 13, wherein the fan is attached to a lateral side of the first heat sink.

18. The heat dissipating device as claimed in claim 17, wherein the first heat sink comprises a fan holder secured to the lateral side of the first heat sink, and the fan is secured to the fan holder.

* * * * *